United States Patent
Sun et al.

(10) Patent No.: US 8,338,838 B2
(45) Date of Patent: Dec. 25, 2012

(54) DOWN-CONVERTED LIGHT SOURCE WITH UNIFORM WAVELENGTH EMISSION

(75) Inventors: Xiaoguang Sun, Woodbury, MN (US); Michael A. Haase, St. Paul, MN (US); Thomas J. Miller, Woodbury, MN (US); Terry L. Smith, Roseville, MN (US); Tommie W. Kelley, Shoreview, MN (US); Catherine A. Leatherdale, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 274 days.

(21) Appl. No.: 12/810,052

(22) PCT Filed: Dec. 9, 2008

(86) PCT No.: PCT/US2008/086060
§ 371 (c)(1),
(2), (4) Date: Aug. 10, 2010

(87) PCT Pub. No.: WO2009/085594
PCT Pub. Date: Jul. 9, 2009

(65) Prior Publication Data
US 2010/0295057 A1    Nov. 25, 2010

Related U.S. Application Data

(60) Provisional application No. 61/009,424, filed on Dec. 28, 2007.

(51) Int. Cl.
*H01L 33/00* (2010.01)

(52) U.S. Cl. ....... 257/88; 257/76; 257/98; 257/E33.005; 257/E33.067

(58) Field of Classification Search .................... 257/88, 257/76, 98, E33.005, E33.067
See application file for complete search history.

(56) References Cited

U.S. PATENT DOCUMENTS

| 7,402,831 | B2 | 7/2008 | Miller | |
|---|---|---|---|---|
| 7,737,621 | B2 * | 6/2010 | Masuda et al. | ................ 313/501 |
| 2002/0139984 | A1 | 10/2002 | Sugawara | |
| 2006/0124917 | A1 | 6/2006 | Miller | |

(Continued)

FOREIGN PATENT DOCUMENTS

JP          10-270799          10/1998

(Continued)

OTHER PUBLICATIONS

International Search Report for PCT/US2008/086060, 3 pgs. (mailed Jul. 20, 2009).

(Continued)

*Primary Examiner* — Tu-Tu Ho
(74) *Attorney, Agent, or Firm* — Kristofor L. Storvick

(57) ABSTRACT

An arrangement of light sources is attached to a semiconductor wavelength converter. Each light source emits light at a respective peak wavelength, and the arrangement of light sources is characterized by a first range of peak wavelengths. The semiconductor wavelength converter is characterized by a second range of peak wavelengths when pumped by the arrangement of light sources. The second range of peak wavelengths is narrower than the first range of peak wavelengths. The semiconductor wavelength converter is characterized by an absorption edge having a wavelength longer than the longest peak wavelength of the light sources. The wavelength converter may also be used for reducing the wavelength variation in the output from an extended light source.

19 Claims, 8 Drawing Sheets

U.S. PATENT DOCUMENTS

| | | |
|---|---|---|
| 2006/0258028 A1 | 11/2006 | Paolini |
| 2007/0096131 A1 | 5/2007 | Chandra |
| 2007/0284592 A1 | 12/2007 | Haase |
| 2010/0283074 A1 | 11/2010 | Kelley |
| 2010/0295075 A1 | 11/2010 | Smith |

FOREIGN PATENT DOCUMENTS

| | | |
|---|---|---|
| JP | 2007-109792 | 4/2007 |
| WO | WO 00/24064 | 4/2000 |
| WO | WO 2005/022654 | 3/2005 |
| WO | WO 2006/062588 | 6/2006 |
| WO | WO 2007/034367 | 3/2007 |

OTHER PUBLICATIONS

Written Opinion of the ISA for International Application No. PCT/US2008/086060, 4 pgs.

\* cited by examiner

DOWN-CONVERTED LIGHT SOURCE WITH UNIFORM WAVELENGTH EMISSION

CROSS REFERENCE TO RELATED APPLICATIONS

This application is a national stage filing under 35 U.S.C. 371 of PCT/US2008/086060, filed on Dec. 9, 2008, which claims priority to U.S. Provisional Application No. 61/009,424, filed on Dec. 28, 2007, the disclosure of which is incorporated by reference in its/their entirety herein.

FIELD OF THE INVENTION

The invention relates to light emitting diodes, and more particularly to a light emitting diode (LED) that includes a wavelength converter for converting the wavelength of light emitted by the LED.

BACKGROUND

Light emitting diodes (LEDs) are commonly made on a semiconductor wafer using a chemical vapor deposition process such as MOCVD. The wafer temperatures in MOCVD fabrication are fairly high, around 800° C.-1000° C., which can lead to problems of uniformity across the wafer. The problems arise because the temperature may not be uniform across the wafer and, in the case of some specific material combinations, the process temperature may be sufficiently high to re-evaporate one or more of the constituent materials. For example, in the case of nitride based LEDs that use indium, such as GaInN LEDs that emit in the blue/green, the process temperature is higher than the re-evaporation temperature of the indium, with the result that the fraction of indium is not uniform across the wafer. This nonuniformity in the indium fraction results in a nonuniformity in the output wavelength of LED devices across the wafer.

This variation in the output wavelength introduces a significant cost to LED manufacturing, since the resulting LED devices produced from the wafer have to be tested and binned according to wavelength. Also, LED users either have to design systems that are tolerant of the variation in peak wavelength or pay the premium costs of binned LEDs.

There is, therefore, a need to reduce the wavelength non-uniformities of LED devices across a wafer.

SUMMARY OF THE INVENTION

An embodiment of the invention is directed to an optical device that has an arrangement of light sources and a semiconductor wavelength converter. Each light source is capable of emitting light at a respective peak wavelength, and the arrangement of light sources is characterized by a first range of peak wavelengths. The semiconductor wavelength converter is attached to the arrangement of light sources. The semiconductor wavelength converter is characterized by a second range of peak wavelengths when pumped by light from the arrangement of light sources. The second range of peak wavelengths is narrower than the first range of peak wavelengths. The semiconductor wavelength converter is characterized by an absorption edge having a wavelength longer than the longest peak wavelength of the light sources.

Another embodiment of the invention is directed to an optical device, that includes an extended light source having a light emitting area. The extended light source is characterized by a first spatial variation of peak wavelengths associated with the light emitting area and a first spatial variation of relative emission intensities associated with the light emitting area. A semiconductor wavelength converter is attached to the light emitting area of the extended light source. The semiconductor wavelength converter has an output surface. The semiconductor wavelength converter is characterized by a second spatial variation of peak wavelengths associated with the output surface when pumped by light from the extended light source. The second spatial variation of peak wavelengths is smaller than the first spatial variation of peak wavelengths. The semiconductor wavelength converter is further characterized by a second spatial variation of relative emission intensities associated with the output surface when pumped by light from the extended light source. The second spatial variation of relative emission intensities is substantially proportional to the first spatial variation of relative emission intensities.

The above summary of the present invention is not intended to describe each illustrated embodiment or every implementation of the present invention. The following figures and detailed description more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
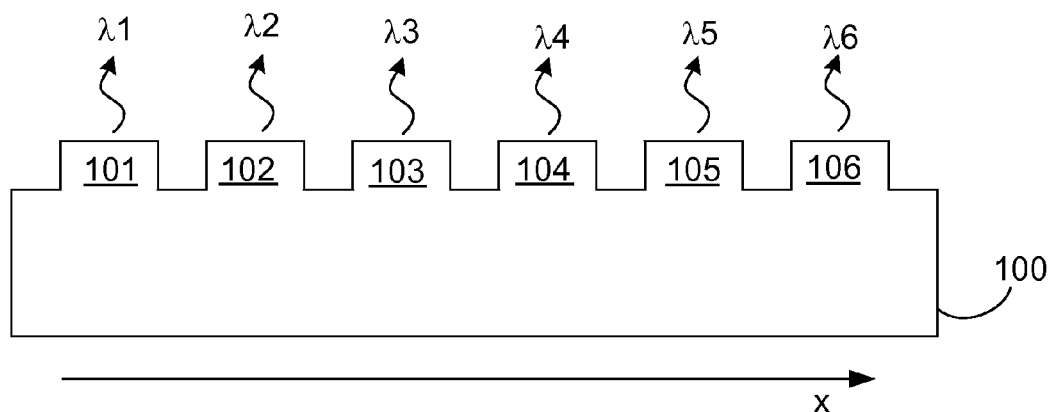
FIG. 1A schematically illustrates an exemplary arrangement of light sources.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to light emitting diodes that use a wavelength converter to convert the wavelength of at least a portion of the light emitted by the LED to a different, typically longer, wavelength. The invention is particularly well suited to a method of efficiently using semiconductor wavelength converters with blue or UV LEDs, which are usually based on a nitride material such as AlGaInN. More particularly, some embodiments of the invention are directed to attaching a multilayer, semiconductor wavelength converter wafer to an LED wafer. Such an assembly can manifest a lower wavelength nonuniformity than the LED wafer itself. Accordingly, LED devices taken from a wavelength converted wafer may not need to be tested and binned according to wavelength, thus reducing the overall manufacturing costs.

The wavelength nonuniformity of an arrangement of light sources 100 is now described with reference to FIGS. 1A-1D. FIG. 1A schematically illustrates an LED wafer as an exemplary arrangement of light sources 100. The LED wafer 100 has a number of LED devices across its width. In the illustration, the wafer 100 has six LED devices 101, 102, 103, 104, 105 and 106, although it will be understood that an LED wafer could have a different number of devices. Each LED device 101, 102, 103, 104, 105, 106 emits light having a spectrum having a peak wavelength, $\lambda 1, \lambda 2, \lambda 3, \lambda 4, \lambda 5, \lambda 6$ respectively.

Figure 1B:
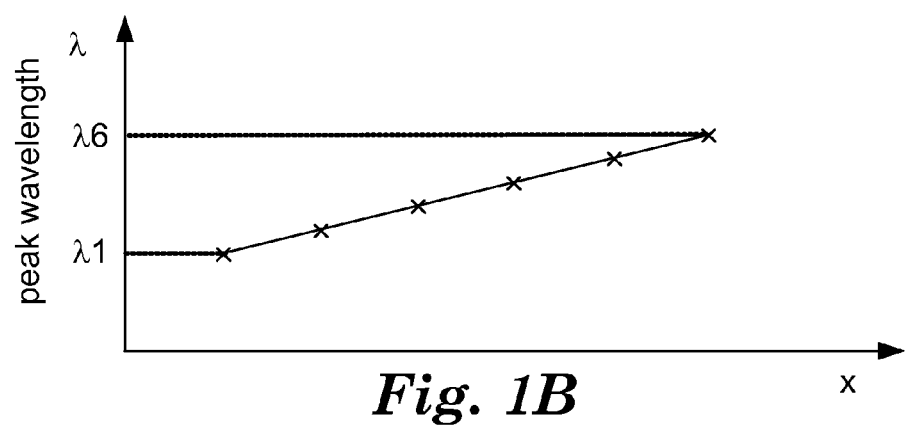
FIG. 1B schematically illustrates variation of light source peak wavelength as a function of position.

The values of $\lambda 1, \lambda 2, \lambda 3, \lambda 4, \lambda 5, \lambda 6$ need not all be the same. In many cases, there is a difference between adjacent values of $\lambda 1, \lambda 2, \lambda 3, \lambda 4, \lambda 5, \lambda 6$. The difference may be regular or irregular. In the illustrated embodiment, as shown in FIG. 1B, the difference is regular across the LED wafer 100, as might be the case where the variation in wavelength is due to processing conditions.

The wavelength variation of the wafer 100 is defined as being the absolute value of the difference between the longest and shortest peak wavelengths. In the illustrated example, the longest peak wavelength is $\lambda 6$ and the shortest peak wavelength is $\lambda 1$. Accordingly, the wavelength uniformity across the illustrated wafer 100 is defined as $|\lambda 6-\lambda 1|$. Thus, a lower value of variation signifies a more uniform output.

Figure 1C:
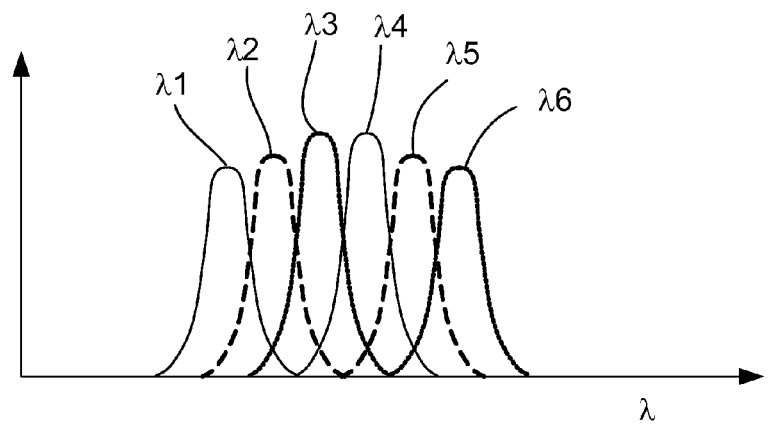
FIG. 1C schematically illustrates spectra obtained from different light sources.

The output spectra of the different LED devices 101-106 is shown in FIG. 1C. This shows that each device 101-106 emits light over a range of wavelengths surrounding the peak wavelength. The spectral output of the wafer 100 is the addition of the output spectra of each of the individual emitting devices 101-106.

Figure 1D:
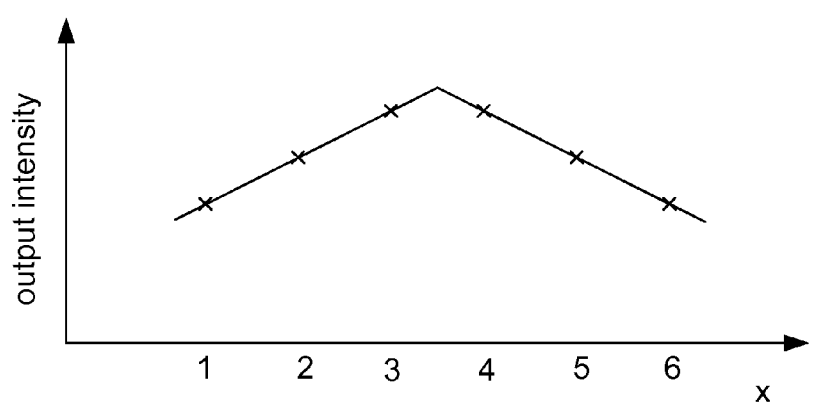
FIG. 1D schematically illustrates an output intensity profile for the arrangement of light sources.

In some embodiments, the devices may output equal amounts of light. It is more commonly found, however, that there is some variation in the amount of light emitted by devices. The variation may be random, or may be systematic. In this illustrative example, as shown in FIGS. 1C and 1D, output intensity is highest for those devices 103, 104 closer to the center of the wafer 100 and lower for devices 101, 106 close to the edges of the wafer 100 even though the drive currents are equal for all LEDs 101-106. It will be appreciated that the optical power emitted by the devices may be non-uniform in some other manner, for example the power may vary from low to high from one side of the wafer to the other, or may have a minimum in the center of the wafer.

Figure 2A:
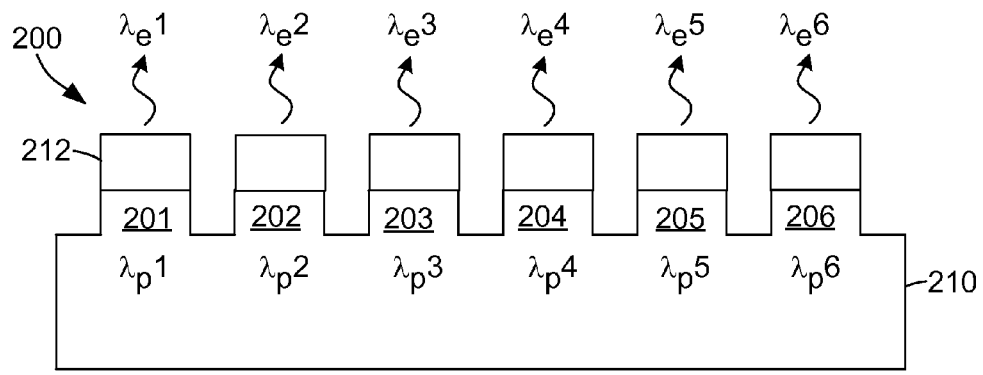
FIG. 2A schematically illustrates an exemplary arrangement of light sources with a wavelength converter, according to principles of the present invention.

An example of an arrangement of light sources 200 that includes a wavelength converter is schematically illustrated in FIG. 2A, which shows an LED wafer 210 as an example of an arrangement of light sources. The LED wafer 210 has a number of individual LED devices. The LED devices may be monolithically integrated on the wafer 210, for example by being grown on the wafer 210. In the illustrated embodiment, the wafer 210 has six LED devices 201-206, although the wafer 210 may have a different number of LED devices. The LED devices 201-206 each emit pump light having a respective peak wavelength $\lambda_p 1$-$\lambda_p 6$.

A multilayer semiconductor wavelength converter wafer 212 is attached to the LED wafer 210. At least some of the pump light emitted by the LED devices 201-206 propagates into the wavelength converter wafer 212 where it is absorbed and re-emitted at a longer different wavelength. The wavelength converter wafer 212 may be directly bonded to the LED wafer 210, for example as is discussed in detail in U.S. Provisional Patent Application Ser. No. 61/012,604, or may be attached to the LED wafer 210 by an adhesive layer, as is discussed in greater detail in U.S. Patent Provisional Application Ser. No. 60/978,304.

One suitable type of multilayer semiconductor wavelength converter 212 is described in U.S. patent application Ser. No. 11/009,217 and in U.S. Provisional Patent Application 60/978,304. A multilayered wavelength converter typically employs multilayered quantum well structures. The semiconductor materials used in the multilayered wavelength converter are selected based on the wavelength of light emitted by the LEDs and the desired wavelength of the converted light. For example, II-VI semiconductor materials may be used for converting the output from a GaInN blue or UV emitting LED wafer to green light. In another example, III-V semiconductor materials may be used for converting the output from a green-emitting, Ga-based or GaInN-based LED to red or near infrared light.

In a multilayered wavelength converter, absorbing layers are provided with a band gap having an energy selected so that at least some of the pump light emitted by the LEDs is absorbed. The charge carriers generated by absorption of the pump light move into other portions of the structure, the potential wells, typically quantum wells, having a smaller band gap where the carriers recombine and generate light at the longer wavelength. This description is not intended to limit the types of semiconductor materials or the multilayered structure of the wavelength converter.

Figure 3:
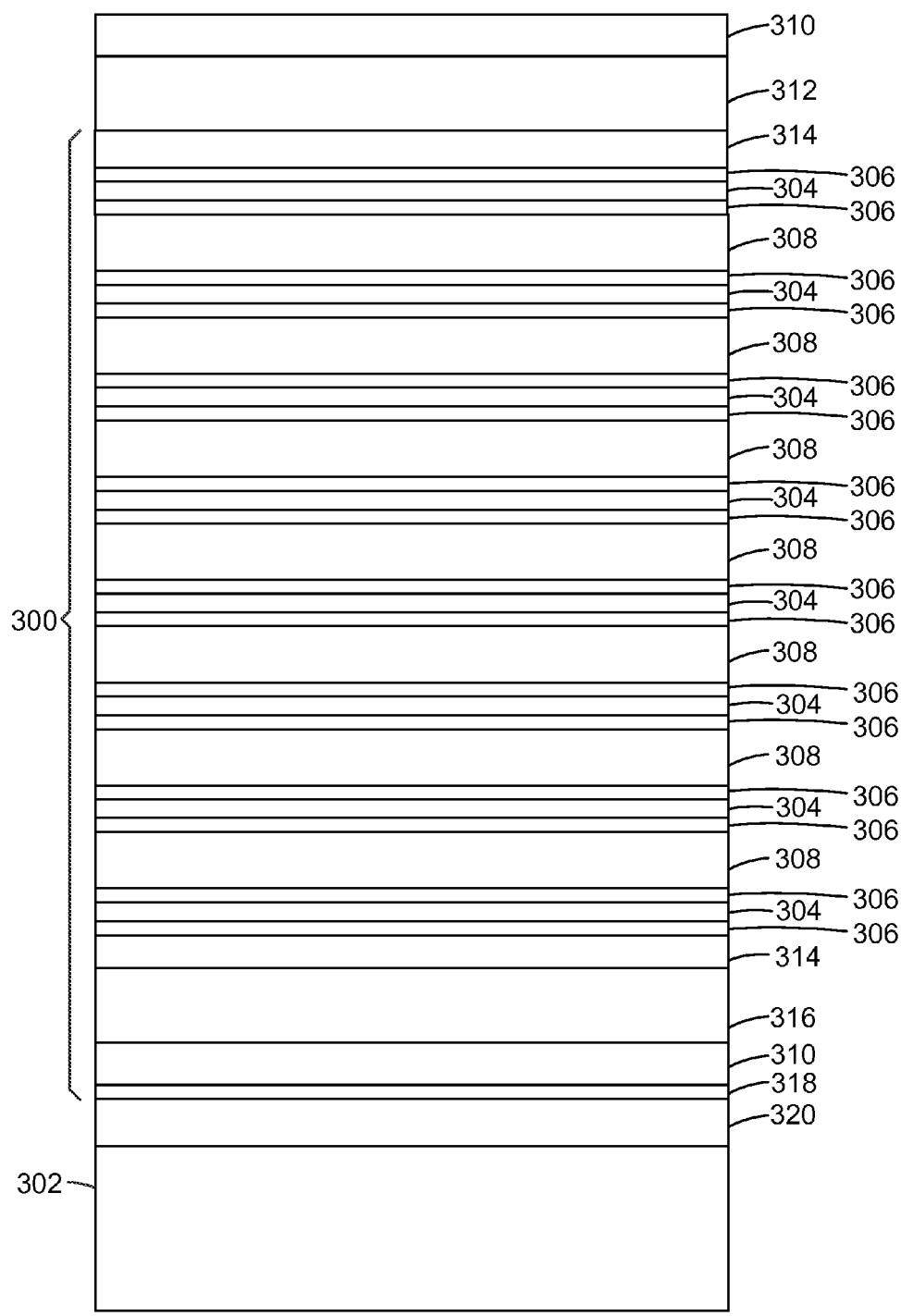
FIG. 3 schematically illustrates an embodiment of a multilayer semiconductor wavelength converter.

One particular example of a suitable wavelength converter is described in U.S. Provisional Patent Application Ser. No. 60/978,304. A multilayer, quantum well semiconductor converter 300 was initially prepared on an InP substrate using molecular beam epitaxy (MBE). A GaInAs buffer layer was first grown by MBE on the InP substrate to prepare the surface for II-VI growth. The wafer was then moved through an ultra-high vacuum transfer system to another MBE chamber for growth of the II-VI epitaxial layers for the converter. The details of the as-grown converter 300, complete with substrate 302, are shown in FIG. 3 and summarized in Table I. The table lists the thickness, material composition, band gap and layer description for the different layers in the converter 300. The converter 300 included eight CdZnSe quantum wells 304, each having an energy gap (Eg) of 2.15 eV. Each quantum well 304 was sandwiched between CdMgZnSe absorber layers 306 having an energy gap of 2.48 eV that could absorb the blue light emitted by a GaInN LED. The converter 300 also included various window, buffer and grading layers.

TABLE I

Details of Various Wavelength Converter Layers

| Layer No. | Material | Thickness (Å) | Band Gap (eV) | Description |
|---|---|---|---|---|
| 304 | $Cd_{0.48}Zn_{0.52}Se$ | 31 | 2.15 | Quantum well |
| 306 | $Cd_{0.38}Mg_{0.21}Zn_{0.41}Se$ | 80 | 2.48 | Absorber |
| 308 | $Cd_{0.38}Mg_{0.21}Zn_{0.41}Se:Cl$ | 920 | 2.48 | Absorber |
| 310 | $Cd_{0.22}Mg_{0.45}Zn_{0.33}Se$ | 1000 | 2.93 | Window |
| 312 | $Cd_{0.22}Mg_{0.45}Zn_{0.33}Se$-$Cd_{0.38}Mg_{0.21}Zn_{0.41}Se$ | 2500 | 2.93-2.48 | Grading |
| 314 | $Cd_{0.38}Mg_{0.21}Zn_{0.41}Se:Cl$ | 460 | 2.48 | Absorber |
| 316 | $Cd_{0.38}Mg_{0.21}Zn_{0.41}Se$-$Cd_{0.22}Mg_{0.45}Zn_{0.33}Se$ | 2500 | 2.48-2.93 | Grading |
| 318 | $Cd_{0.39}Zn_{0.61}Se$ | 44 | 2.24 | |
| 320 | $Ga_{0.47}In_{0.53}As$ | 1900 | 0.77 | Buffer |

The back surface of the InP substrate 302 may be mechanically lapped and removed with a solution of $3HCl:1H_2O$ after the wavelength converter 300 is attached to the LED wafer. This etchant stops at the GaInAs buffer layer 320. The buffer layer 320 may subsequently be removed in an agitated solution of 30 ml ammonium hydroxide (30% by weight), 5 ml hydrogen peroxide (30% by weight), 40 g adipic acid, and 200 ml water, leaving only the II-VI semiconductor wavelength converter 300 attached to the LED.

Different areas of the wavelength converter wafer 212 emit light at different wavelengths. For example, the area of the wafer 212 primarily above LED 201 emits light having a peak wavelength of $\lambda_e 1$. Similarly, the areas of the converter wafer 212 above LEDs 202-206 respectively emit light having peak wavelengths of $\lambda_p 2$-$\lambda_p 6$. The small positional variation in the wavelength of the light emitted by the converter wafer 212 is typically a result of manufacturing processes, such as temperature variation across the wafer during converter layer deposition.

Figure 2B:
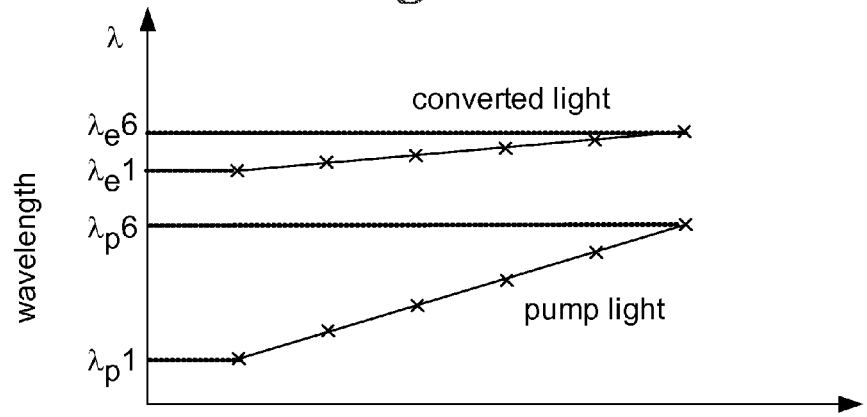
FIG. 2B schematically illustrates variation of pump light peak wavelength and converted light peak wavelength as a function of position.
Figure 2C:
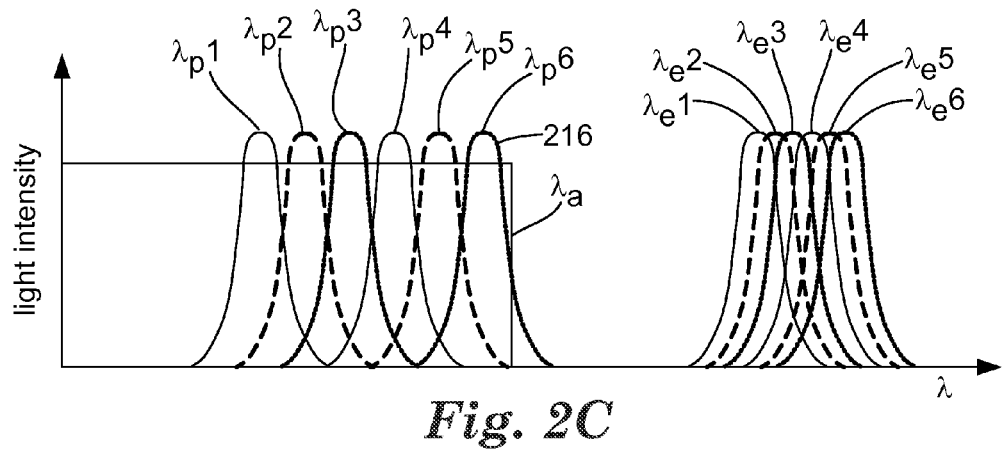
FIG. 2C schematically illustrates different pump spectra and different converted light spectra.

FIG. 2B shows an exemplary graph of the pump wavelength, $\lambda_p$, vs. position, x, across the LED wafer 210, and also for the converted wavelength, $\lambda_e$, as a function of position, x. FIG. 2C shows the spectral output for the different LEDs, in a manner similar to that if FIG. 1C. The range of peak pump wavelengths $|\lambda_p 1 - \lambda_p 6|$ is larger than the range of peak converted light wavelengths $|\lambda_e 1 - \lambda_e 6|$.

The variable $\lambda_a$ represents the band edge for pump wavelength absorption in the wavelength converter 212. The value of $\lambda_a$ is dependent on the composition of the semiconductor material used for absorbing light in the semiconductor wavelength converter, and can be selected by changing the composition. The value of $\lambda_a$ can be set longer than the longest peak wavelength of the light emitted by the LED wafer 210 by selecting the precise ratios of the materials that form the absorbing material in the wavelength converter. For example, in the exemplary wavelength converter illustrated in FIG. 3, the ratios of Zn, Cd and Mg are selected so that the energy gap of the absorbing material is 2.48 eV, corresponding to $\lambda_a$ being equal to 500 nm.

The value of $\lambda_a$ may be set to be longer than the longest peak wavelength of the LEDs 201-206 on the LED wafer 210. In the illustrative example, the longest peak wavelength is $\lambda_6$, and so $\lambda_a$ may be set to be greater than $\lambda_6$. The value of $\lambda_a$ may also be selected so that a chosen fraction of the light associated with the LED having the longest pump wavelength is shorter than the value of $\lambda_a$. To illustrate, consider the illustrative example, in which LED 206 produces pump light having the longest peak wavelength, $\lambda_6$. The spectrum of pump light emitted by LED 206 is spectrum 216, as shown in FIG. 2C. The value of $\lambda_a$ may also be selected so that a given fraction of the light emitted by the longest peak wavelength LED 206 lies to the short wavelength side of $\lambda_a$. An alternative way of saying this is that the area of the spectrum 216 lying to the left of $\lambda_a$ is a desired fraction of the total area of spectrum 216. For example, the value of $\lambda_a$ may be chosen so that at least 80% of the light in spectrum 216 has a shorter wavelength than $\lambda_a$. Other exemplary criteria are that at least 95% or 99% of the light emitted by the longest peak wavelength LED has a shorter wavelength than $\lambda_a$.

The spectral outputs from the different regions of the wavelength converter 212, having peak wavelengths $\lambda_e 1$-$\lambda_e 6$ are also shown in FIG. 2C. There is some spread of the peak wavelengths, but the spread is less than that of the pump light. One of the reasons for this is that the wavelength converter can be made using a molecular beam epitaxy method, which can require significantly lower growth temperatures than MOCVD. The resulting structural and concomitant optical nonuniformities are less pronounced than in the devices grown at high temperatures with MOCVD.

For a given pump wavelength, the converted output power, i.e. the optical power at the converted wavelengths, varies substantially linearly with input pump power: a change in pump power of a factor of two results in a similar factor of two change in the converted power. If the value of $\lambda_a$ is set to be larger than most of the spectrum of the longest peak wavelength light source, then the wavelength converter absorbs approximately the same fraction of light from each light source. As a result, the intensity profile of the converted light emitted across the wavelength converter is substantially similar to the intensity profile of the pump light entering the wavelength converter.

Figure 2D:
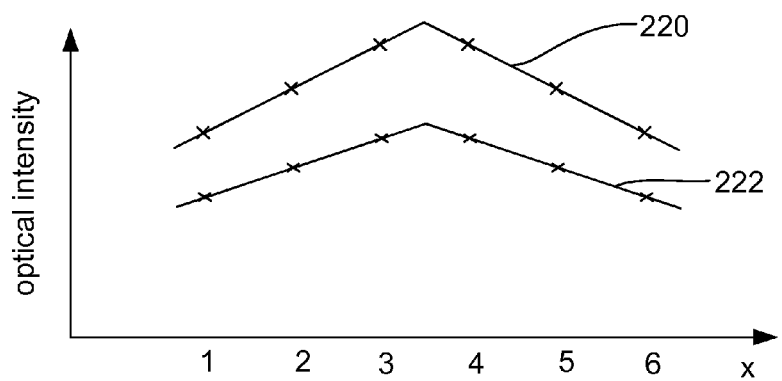
FIGS. 2D and 2E schematically illustrate pump light and converted light intensity profiles for different embodiments of wavelength converter.

In illustration, consider the exemplary pump light intensity profile shown in FIG. 2D as curve 220. The curve represents the intensity of pump light as a function of position across the LED 210. The digits 1-6 represent the positions of LEDs 201-206 respectively. According to this example, the LEDs 201 and 206 emit less light than the central LEDs 203 and 204. It should be noted that the spectra shown in FIG. 2C omitted variations in magnitude in order to simplify the discussion of wavelength uniformity.

Curve 222 represents the intensity profile of the wavelength converted light. In this example, where the value of $\lambda_a$ is set to absorb substantially all light of the spectrum having the longest peak wavelength, the intensity profile 222 closely follows the profile 220 of the pump light, i.e. the profile 222 is proportional to the profile 220, i.e. their shapes are substantially the same except for a scaling factor.

Figure 2E:
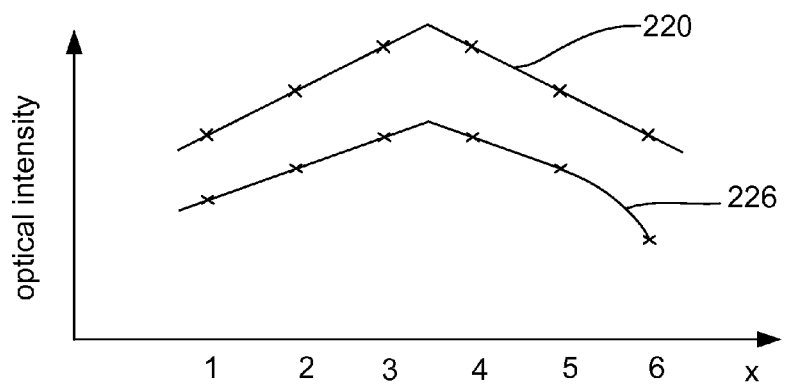

FIG. 2E shows a similar case, but it is assumed that $\lambda_a$ is set to a shorter value than that for FIG. 2D, so that the fraction of the longest peak wavelength spectrum 216 that is absorbed by the wavelength converter is substantially less than 100%. As a result, less converted light is emitted at position 6, and so the profile 226 of the wavelength converted light is no longer proportional to the profile 220 of the pump light 220. Thus, the intensity profile of the wavelength converted light is substantially proportional to the intensity profile of the pump light when substantially all the pump light is absorbed. However, if $\lambda_a$ is set so that at least some of the longest peak wavelength spectrum is not absorbed, then the intensity profile of the converted light is not proportional to the intensity profile of the pump light, and is less uniform.

EXAMPLE

Figure 4:
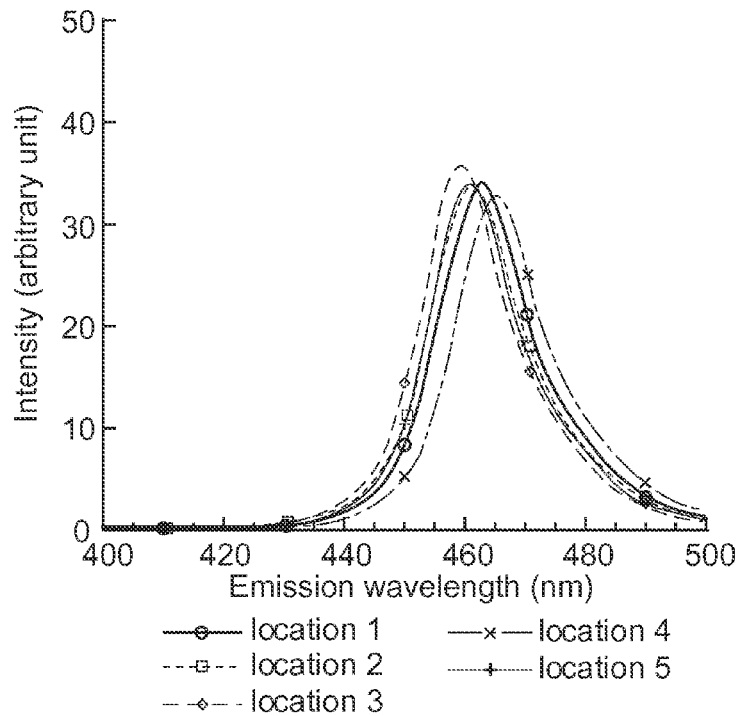
FIG. 4 presents spectra measured from an LED wafer.

The emission spectrum from a blue GaInN LED wafer obtained from Epistar Corp., Hsinchu, Taiwan, was measured at five different locations across the wafer. The results are shown in FIG. 4. The peak wavelength for the various recorded spectra varies from 460 nm to 466 nm across the wafer, i.e. the wavelength variation was around 6 nm (about 1.3% of the wavelength).

Figure 5:
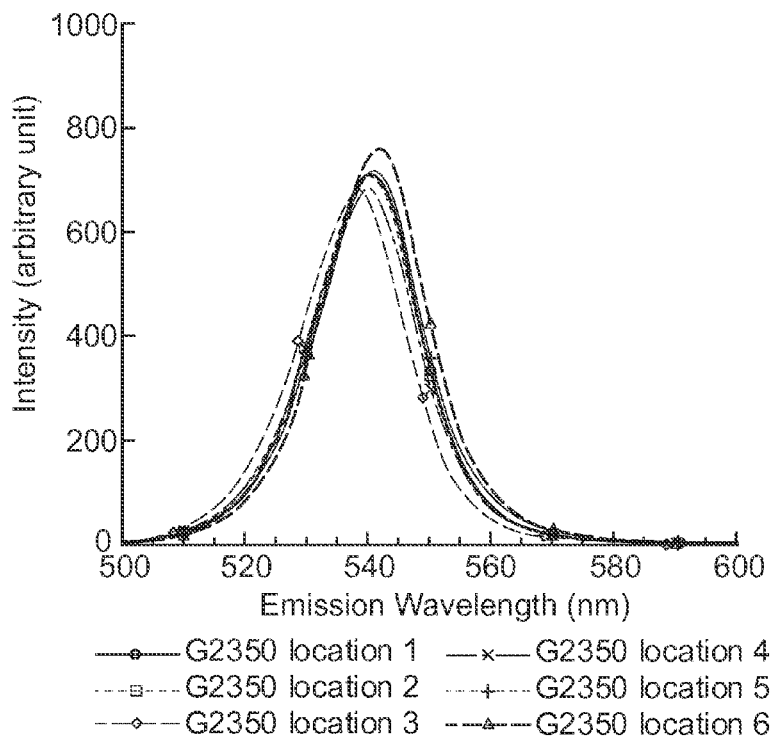
FIG. 5 presents photoluminescence spectra measured from a semiconductor wavelength converter.

A wavelength conversion wafer, of the type illustrated in FIG. 3, was excited with a blue laser diode and the photoluminescent spectrum measured at various locations across the wafer. The results are shown in FIG. 5. The wavelength across the wavelength converter varies by about 2.5 nm (about 0.46% of the wavelength), significantly more uniform than the LED wafer alone.

The wavelength variation of currently available GaInN-based green LED wafers is significantly worse than the 6 nm measured for the blue LED wafer, due to the higher amounts of indium which is affected by segregation and re-evaporation. Therefore, a green-emitting wavelength converted wafer can provide substantially higher wavelength uniformity than a wafer of green-emitting GaInN LEDs, which may reduce the need for wavelength testing and binning.

The invention is also applicable to extended light sources, where the peak emission wavelength may vary across the emitting area of the extended light source. One particular example of an extended light source is an LED that has a large emitting surface, for example 0.5 mm×0.5 mm or larger. When the emitting area of an LED becomes larger, the peak wavelength emitted from various points across the emitting surface varies more, for reasons like those discussed above.

Figure 6A:
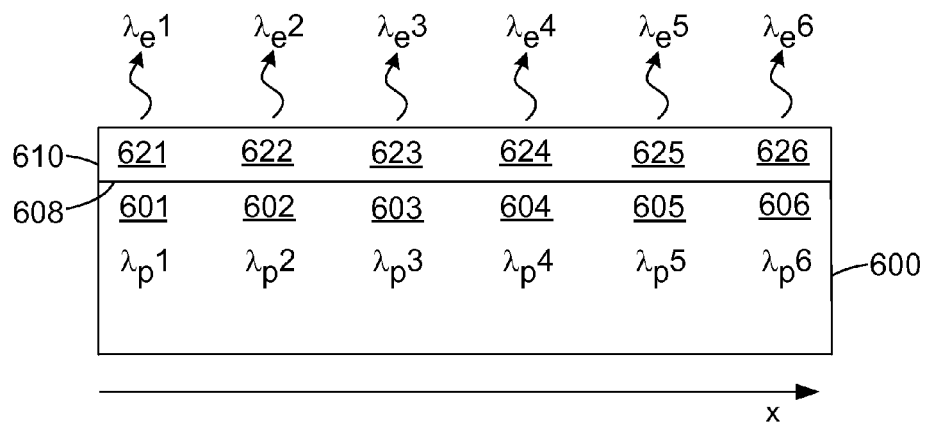
FIG. 6A schematically illustrates an exemplary extended light source with a wavelength converter, according to principles of the present invention.
Figure 6B:
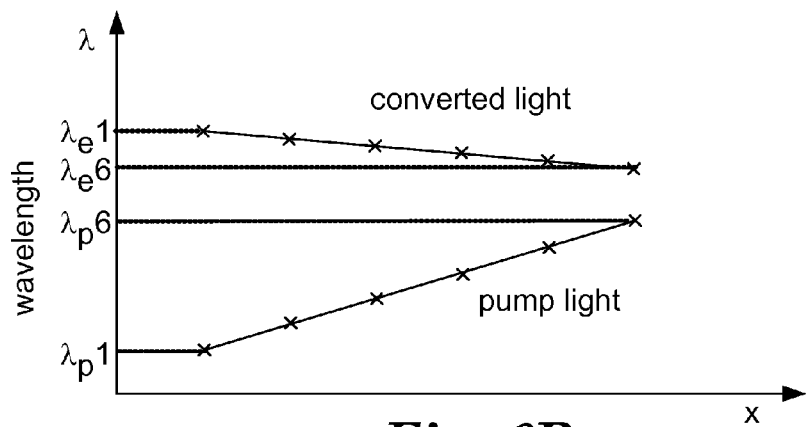
FIG. 6B schematically illustrates variation of pump light peak wavelength and converted light peak wavelength as a function of position.
Figure 6C:
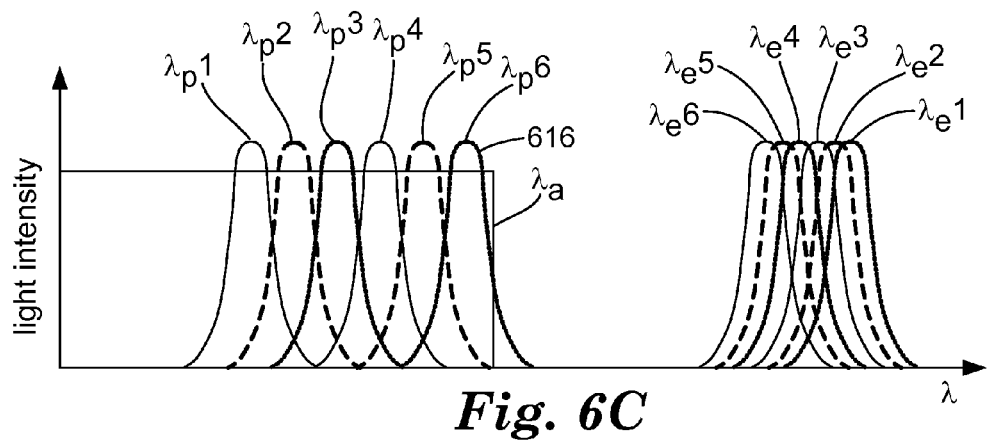
FIG. 6C schematically illustrates different pump spectra and different converted light spectra.

An example of an extended light source 600 is presented schematically in FIG. 6A, which may be an LED, that has an emitting area 608 that can be considered to have a number of emitting regions, shown as regions 601-606, with associated peak pump wavelengths $\lambda_p1$-$\lambda_p6$. The peak pump wavelengths need not be the same: FIG. 6B shows an exemplary plot of the pump peak wavelength as a function of position across the light source 600 and FIG. 6C shows spectra, having respective peak wavelengths $\lambda_p1$-$\lambda_p6$ that are associated with the emitting regions 601-606.

A semiconductor wavelength converter 610 is attached to the extended light source 600. The semiconductor wavelength converter 610 may be a multilayer semiconductor wavelength converter of the type described above. The semiconductor wavelength converter 610 includes a semiconductor material for absorbing the pump light emitted by the extended light source 600. The semiconductor wavelength converter 610 also emits light at a longer wavelength, referred to as the converted light.

Different regions 621-626 of the semiconductor wavelength converter 610 are pumped mostly by pump light from respective regions 601-606 of the extended light source 600. The spectra of converted light emitted from each of the regions 621-626 have respective peak wavelengths $\lambda_e1$-$\lambda_e6$. The values of $\lambda_e1$-$\lambda_e6$ need not all be the same. FIG. 6B shows an exemplary plot of the converted peak wavelengths as a function of position across the light source 600 and FIG. 6C shows spectra, having respective peak wavelengths $\lambda_e1$-$\lambda_e6$ that are associated with the emitting regions 621-626. The variation in converted peak wavelength is substantially independent of the variation in the pump peak wavelength: both arise from the various processing conditions extant at the time of fabrication. In the example shown in FIGS. 6A-6E, the pump wavelength increases with position across the extended light source from left to right, while the converted wavelength reduces with position across the extended light source from left to right. It will be appreciated that the spatial variation of both $\lambda_p$ and $\lambda_e$ may be different from that shown.

In a manner similar to that discussed above, the wavelength converter has an associated absorption wavelength $\lambda_a$ which corresponds to the band gap in the absorbing semiconductor material. The value of $\lambda_a$ may be selected to be longer than the longest peak pump wavelength ($\lambda_p6$ in the current example) and may be set so that at least 80%, 95% or 99% of the power light within the spectrum of the longest peak pump wavelength has a shorter wavelength than $\lambda_a$. The uniformity of the converted peak wavelengths is better than that of the pump light.

If the value of $\lambda_a$ is set to be larger than most of the spectrum of the longest peak wavelength of the extended light source 600, then the wavelength converter 610 absorbs approximately the same fraction of light from each region of the extended light source 600. As a result, the profile of the intensity of the converted light across the wavelength converter is substantially similar to the profile of the intensity of the pump light entering the wavelength converter.

Figure 6D:
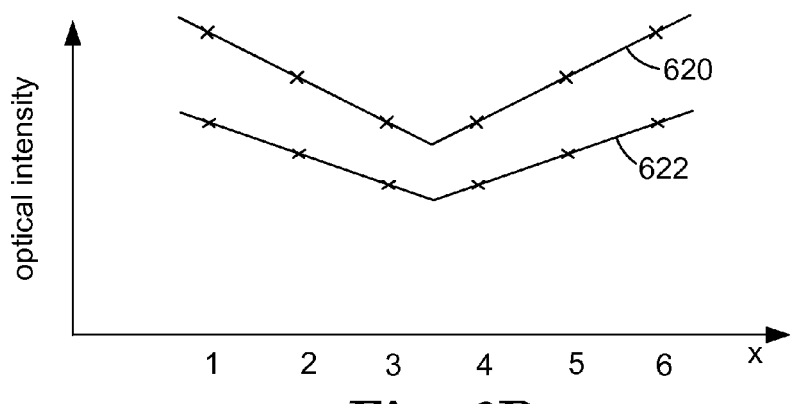
FIGS. 6D and 6E schematically illustrate pump light and converted light intensity profiles for different embodiments of wavelength converter.

In illustration, consider the exemplary pump light intensity profile shown in FIG. 6D as curve 620. The curve represents the intensity of pump light as a function of position across the extended light source 610. The digits 1-6 represent the regions 201-206 of the extended light source respectively. According to this example, the edge regions 601 and 606 emit more pump light than the central regions 603 and 604. It should be noted that the spectra shown in FIG. 6C omitted variations in magnitude in order to simplify the discussion of wavelength uniformity.

Curve 622 represents the intensity profile of the wavelength converted light. In this example, where the value of $\lambda_a$ is set to absorb substantially all light of the spectrum having the longest peak wavelength, the intensity profile 622 is proportional to the profile 620 of the pump light, i.e. their shapes are similar except for a scaling factor.

Figure 6E:
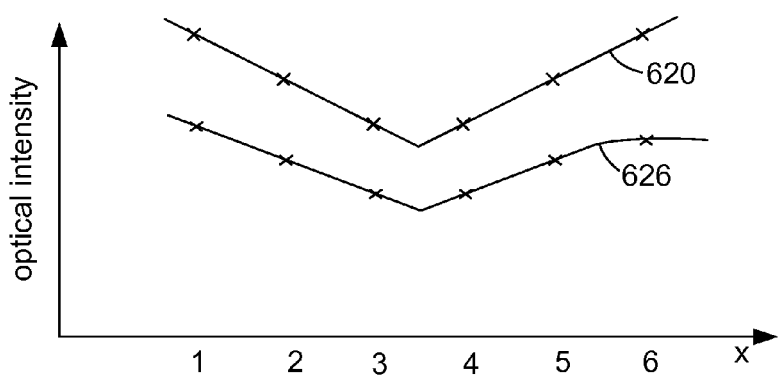

FIG. 6E shows a similar case, but in this example it is assumed that $\lambda_a$ is set to a shorter value than that for FIG. 6D, so that the fraction of the longest peak wavelength spectrum 616 that is absorbed by the wavelength converter 610 is substantially less than 100%. As a result, less converted light is emitted at position 6, and so the profile 626 of the wavelength converted light is no longer proportional to the profile 620 of the pump light 620.

The present invention should not be considered limited to the particular examples described above, but rather should be understood to cover all aspects of the invention as fairly set out in the attached claims. In particular, it should be understood that the various examples of peak wavelength and peak intensity variation were provided only for illustrative purposes, and the invention is not intended to be limited to devices in which the peak wavelength and peak intensity wavelength vary in the manner shown in the examples. For example, the longest peak wavelength may be found in the center of an arrangement of light sources or extended light source, and not necessarily at the edge. Also, the peak intensity need not be found at either the edge or the center of the arrangement of light sources, or extended light source, but may be at some other location.

Additionally, while the above description has discussed GaN-based LEDs, the invention is also applicable to LEDs fabricated using other III-V semiconductor materials, and also to LEDs that use II-VI semiconductor materials. Also, the wavelength converter is not limited to being formed of a II-VI semiconductor material, but may also be formed of a III-V semiconductor material. Consequently, the wavelengths over which the invention is applicable are considerably greater in range than the particular example discussed herein. For example, a wavelength converter may be used to reduce the peak wavelength variation of blue, green and/or yellow light sources to produce light in the red or infrared that has reduced wavelength variation.

Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. An optical device, comprising:
    an arrangement of light sources, each light source capable of emitting light at a respective peak wavelength, the arrangement of light sources being characterized by a first range of peak wavelengths; and
    a semiconductor wavelength converter wafer attached to the arrangement of light sources, the semiconductor wavelength converter wafer being characterized by a second range of peak wavelengths when pumped by light from the arrangement of light sources, the second range of peak wavelengths being narrower than the first range of peak wavelengths; the semiconductor wavelength converter wafer being characterized by an absorption edge having a wavelength longer than the longest peak wavelength of the light sources.

2. A device as recited in claim 1, wherein the arrangement of light sources comprises an arrangement of light emitting diodes (LEDs).

3. A device as recited in claim 2, wherein the LEDs are monolithically integrated on a wafer.

4. A device as recited in claim 2, wherein the LEDs are GaN-based LEDs.

5. A device as recited in claim 1, wherein the semiconductor wavelength converter wafer comprises a II-VI multilayer semiconductor wavelength converter wafer.

6. A device as recited in claim 5, wherein the light sources comprise GaN-based LEDs monolithically integrated on a wafer.

7. A device as recited in claim 1, wherein the absorption edge is set so that at least about 95% of the light emitted by the light source associated with the longest peak wavelength has a wavelength shorter than the absorption edge wavelength.

8. A device as recited in claim 1, wherein the absorption edge is set so that at least about 99% of the light emitted by the light source associated with the longest peak wavelength has a wavelength shorter than the absorption edge wavelength.

9. A device as recited in claim 1, wherein the arrangement of light sources is characterized by a first emission intensity profile and the semiconductor wavelength converter is characterized by a second emission intensity profile that is substantially proportional to the first emission intensity profile.

10. A device as recited in claim 1, wherein the wavelength converter is adhesively attached to the arrangement of light sources.

11. A device as recited in claim 1, wherein the wavelength converter is optically bonded to the arrangement of light sources.

12. An optical device, comprising:
    an extended light source having a light emitting area, the extended light source being characterized by a first spatial variation of peak wavelengths associated with the light emitting area and a first spatial variation of relative emission intensities associated with the light emitting area;
    a semiconductor wavelength converter attached to the light emitting area of the extended light source, the semiconductor wavelength converter having an output surface, the semiconductor wavelength converter being characterized by a second spatial variation of peak wavelengths associated with the output surface when pumped by light from the extended light source, the second spatial variation of peak wavelengths being smaller than the first spatial variation of peak wavelengths, the semiconductor wavelength converter further being characterized by a second spatial variation of relative emission intensities associated with the output surface when pumped by light from the extended light source, the second spatial variation of relative emission intensities being substantially proportional to the first spatial variation of relative emission intensities.

13. A device as recited in claim 12, wherein the extended light source is a light emitting diode (LED).

14. A device as recited in claim 13, wherein the LED is a GaN-based LED.

15. A device as recited in claim 12, wherein the semiconductor wavelength converter comprises a II-VI multilayer semiconductor wavelength converter.

16. A device as recited in claim 12, wherein semiconductor wavelength converter is characterized by an absorption band set at a wavelength so that at least about 95% of the light emitted by the extended light source has a wavelength shorter than the absorption edge wavelength.

17. A device as recited in claim 16, wherein the absorption band is set at a wavelength so that at least about 99% of the light emitted by the extended light source has a wavelength shorter than the absorption edge wavelength.

18. A device as recited in claim 12, wherein the semiconductor wavelength converter is adhesively attached to the extended light source.

19. A device as recited in claim 12, wherein the semiconductor wavelength converter is optically bonded to the extended light source.

* * * * *